(12) United States Patent
Sakairi

(10) Patent No.: US 6,576,334 B2
(45) Date of Patent: Jun. 10, 2003

(54) BONDING MATERIALS

(75) Inventor: Mikio Sakairi, Kanuma (JP)

(73) Assignee: Sony Chemicals Corp., Tokyo (JP)

( * ) Notice: Subject to any disclaimer, the term of this patent is extended or adjusted under 35 U.S.C. 154(b) by 0 days.

(21) Appl. No.: 09/784,099

(22) Filed: Feb. 16, 2001

(65) Prior Publication Data

US 2001/0021547 A1 Sep. 13, 2001

(30) Foreign Application Priority Data

Feb. 22, 2000 (JP) .......................................... 2000-050486

(51) Int. Cl.[7] .......................... B32B 27/00; B32B 27/20; B32B 15/02
(52) U.S. Cl. ......................... 428/323; 428/402; 428/457
(58) Field of Search ................................ 428/323, 328, 428/330, 402, 327, 457, 458, 460, 461, 462, 463, 416

(56) References Cited

U.S. PATENT DOCUMENTS 4,113,658 A * 9/1978 Geus ........................... 252/454

FOREIGN PATENT DOCUMENTS

| JP | 05078642 | * 3/1993 |
| JP | A 9-199207 | 7/1997 |
| JP | 410245528 A | * 9/1998 |

OTHER PUBLICATIONS

Translation of JP05078642.*

* cited by examiner

Primary Examiner—Stevan A. Resan
Assistant Examiner—Nikolas J Uhlir
(74) Attorney, Agent, or Firm—Oliff & Berridge, PLC

(57) ABSTRACT

The present invention aims to provide a bonding material with excellent adhesion, electric connection and insulation properties, which can be used to bond the sides of a pair of members to be connected having a plurality of electrodes without causing short circuit between adjacent electrodes even under the application of high voltage or high current across opposite electrodes on the members to be connected, by bonding members to be connected with the bonding material of the present invention without causing short circuit between adjacent electrodes, even under the application of high voltage across opposite electrodes, because the bonding material of the present invention contains metal ion scavenger particles containing a bismuth-based ion exchanger and a vinyl triazine compound and having an average particle diameter smaller than that of conductive particles.

4 Claims, 2 Drawing Sheets

BONDING MATERIALS

FIELD OF THE INVENTION

The present invention relates to bonding materials for connecting members to be connected having opposite electrodes, particularly to bonding materials suitable for connecting members to be connected having electrodes undergoing high voltage and high current.

PRIOR ART

Anisotropic conductive films have been substituted for solders conventionally used as bonding materials for connecting members to be connected having opposite electrodes. These anisotropic conductive films are bonding materials comprising conductive particles dispersed in a thermosetting resin and they are inserted between members to be connected for thermocompression bonding so that the conductive particles come into contact with electrodes to establish electric connection between the electrodes while the resin is cured with the conductive particles dispersed therein to ensure insulation between adjacent electrodes and mechanical bonding between members to be connected in regions where electrodes are not present.

Such anisotropic conductive films have anisotropic conductivity allowing opposite electrodes to be electrically connected while adjacent electrodes are insulated. They are used to mount a semiconductor element on a printed wiring board or to connect a printed wiring board to another printed wiring board such as a flexible printed wiring board or to connect a printed wiring board to an ordinary liquid crystal display device.

However, these anisotropic conductive films are generally considered to be suitable for connecting electrodes at low voltage and low current but ineffective for ensuring electric connection or insulation when high voltage or high current is applied across electrodes. For example, it is difficult to connect a plasma display panel and a flexible printed wiring board via an anisotropic conductive film but solder is still used for this purpose because plasma display panels undergo high voltage and high current at 50 V through 500 V and 500 mA through 2 A.

Investigations into the causes of unsuitability of anisotropic conductive films for high voltage or high current applications revealed that a major cause is short circuit between adjacent electrodes due to migration of metal ions from electrodes under conduction. Such migration was found to increase with voltage or current.

DISCLOSURE OF THE INVENTION

An object of the present invention is to provide a bonding material with excellent adhesion, electric connection and insulation properties, which can be used to connect members to be connected having opposite electrodes for high voltage or high current applications without inducing short circuit between adjacent electrodes even under the application of high voltage or high current.

The present invention provides a bonding material for connecting members to be connected having opposite electrodes, the bonding material comprising conductive particles, metal ion scavenger particles for scavenging metal ions liberated from the electrodes, and a resin component based on a thermosetting resin, wherein the metal ion scavenger particles have an average particle diameter smaller than that of the conductive particles.

In the bonding material of the present invention, the metal ion scavenger particles comprise at least one of a bismuth-based ion exchanger and a vinyl triazine compound.

In the bonding material of the present invention, the metal ion scavenger particles are present 1.5 parts by weight or more but 60 parts by weight or less per 100 parts by weight of the resin component.

In the bonding material of the present invention, the metal ion scavenger particles are present 3 parts by weight or more but 50 parts by weight or less per 100 parts by weight of the resin component.

In the bonding material of the present invention, the conductive particles have an average particle diameter of 1 μm or more but 60 μm or less and the metal ion scavenger particles have an average particle diameter of 0.1 μm or more but less than 10 μm.

In the bonding material of the present invention, the metal ion scavenger particles have a specific surface area of 0.8 $m^2/g$ or more but 100 $m^2/g$ or less.

The present invention also provides a bonded assembly comprising opposite electrodes and a bonding material inserted between the electrodes and heat-cured to at least electrically connect the electrodes, the bonding material comprising conductive particles, metal ion scavenger particles for scavenging metal ions liberated from the electrodes, and a resin component based on a thermosetting resin, wherein the metal ion scavenger particles have an average particle diameter smaller than that of the conductive particles and wherein the voltage applied across the opposite electrodes is 50 V or more but 500 V or less.

Members to be connected according to the present invention are any members having opposite electrodes, particularly a number of electrodes, but the present invention is suitable for connecting members having electrodes undergoing a high voltage of 50 V or more but 500 V or less, especially 70 V or more but 300 V or less or a high current of 100 mA or more but 10 A or less, especially 200 mA or more but 5 A or less. Connections between such members include connection between a plasma display panel as described above or a printed wiring board for driving it and a flexible printed wiring board to be connected thereto.

These members to be connected have a substrate such as a glass or resin substrate, and flexible printed wiring boards often have a resin substrate made of a polyimide resin. Electrodes formed on these substrates may contain metals dissociating as metal ions such as silver, copper, nickel or chromium but may also contain non-dissociating metals.

Bonding materials of the present invention comprises a thermosetting resin, conductive particles and a metal ion scavenger, and they are inserted between members to be connected and pressurized from both sides so that opposite electrodes are forced into contact with the conductive particles while the resin is concentrated and cured with the conductive particles dispersed therein to bond the members in regions where electrodes are not present, whereby electric connection and mechanical bonding are achieved.

Base resins of thermosetting resins used in bonding materials of the present invention may be any resins that are cured under heating or irradiation such as UV in combination with curing agents, such as epoxy resins, urethane resins, phenol resins, hydroxyl-containing polyester resins or hydroxyl-containing acrylic resins, but preferably epoxy resins in view of the balance of the curing temperature, curing time, storage stability, etc.

Suitable epoxy resins include bisphenol-type epoxy resins, epoxy-novolac resins or epoxy compounds having two or more oxirane groups in their molecule or the like. These resins are commercial available.

The above base resins of thermosetting resins may be generally cured in combination with curing agents, but curing agents may be omitted when a functional group contributing to curing reaction is attached to the base resins. Suitable curing agents are those capable of inducing curing reaction with base resins under heating or irradiation, such as imidazole, amines, acid anhydrides, hydrazides, dicyandiamide and modifications thereof, and are also commercially available. These curing agents are preferably latent curing agents.

Latent curing agents induce curing reaction under heat and pressure (thermocompression bonding) or irradiation such as UV at the curing temperature but not during preparation and storage at normal temperatures and drying under relatively low-temperature conditions in the range of 40° C. through 100° C. Especially preferred such latent curing agents are the above curing agent components such as imidazole or amines microencapsulated and are also commercially available. Heat-activatable curing agents preferably begin curing at a temperature range of 80° C. through 150° C.

Suitable conductive particles include metal particles such as solders or nickel; conductive material-coated particles comprising core particles of a polymer organic compound coated with a conductive material by plating or the like; or insulating material-coated conductive particles comprising these conductive particles coated with an insulating resin. These conductive particles suitably have an average particle diameter of 1 m or more but 20 μm or less, preferably 3 μm or more but less than 10 μm. As used herein, the average particle diameter means the average of the diameters of particles.

Metal ion scavengers are compounds preventing migration by scavenging metal ions dissociating from constituent materials of electrodes, and include ion exchangers, complexing agents or the like, either inorganic or organic. Inorganic species include bismuth-based ion exchangers, antimony-based ion exchangers, bismuth-antimony-based ion exchangers or the like, and organic species include vinyl triazine compounds or the like.

Bismuth-based ion exchangers are ion exchangers containing bismuth as a constituent such as BiO(OH), $BiO(OH)_{0.7}(NO_3)_{0.3}$, $BiO(OH)_{0.74}(NO_3)_{0.15}(HSiO_3)_{0.11}$ or the like. Antimony-based ion exchangers are ion exchangers containing antimony as a constituent such as $Sb_2O_2.2H_2O$. Bismuth-antimony-based ion exchangers are ion exchangers containing bismuth and antimony as constituents such as compositions containing a bismuth-based ion exchanger and an antimony-based ion exchanger as defined above in any ratio such as 5:5 through 7:3.

These ion exchangers are assumed to scavenge metal ions via cation exchange.

Vinyl triazine compounds include vinyl triazine and derivatives thereof or their acid adducts, among which preferred are 2,4-diamino-6-vinyl-S-triazine represented by formula (1), 2,4-diamino-6-vinyl-s-triazine-isocyanuric acid adduct represented by formula (2) and 2,4-diamino-6-methacryloyloxyethyl-s-triazine-isocyanuric acid adduct represented by formula (3). These triazine compounds are assumed to scavenge dissociating metal ions via complex formation.

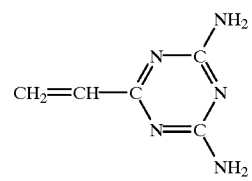

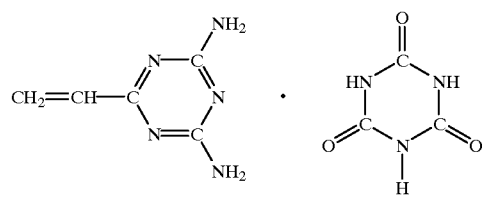

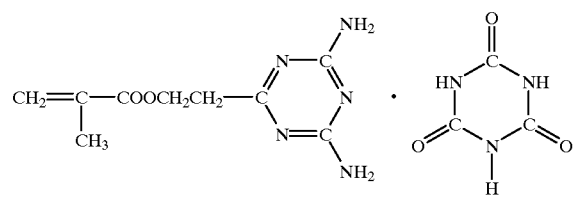

Those metal ion scavengers having a smaller particle diameter than that of conductive particles are suitable. Such metal ion scavengers preferably have an average particle diameter of 0.1 μm or more but less than 10 μm, more preferably 0.1 μm or more but less than 3 μm. Electric connectability during connection can be improved by using a metal ion scavenger having an average particle diameter smaller than that of conductive particles.

Metal ion scavengers preferably have a specific surface area of 0.8 $m^2/g$ or more but 100 $m^2/g$ or less, preferably 1 $m^2/g$ or more but 50 $m^2/g$ or less, whereby they have many opportunities to come into contact with metal ions to effectively prevent migration.

In addition to the above components, thermoplastic resins may also be incorporated to confer applicability or film-forming properties on bonding materials of the present invention. These thermoplastic resins include phenoxy resins, polyester resins, acrylic resins or the like.

Bonding materials of the present invention may also contain other additives, if desired, such as silane-coupling agents, surfactants, antiaging agents or the like for improving affinity for glass substrates.

The ratio of thermoplastic resins to thermosetting resins may be 0% by weight or more but 100% by weight or less, preferably 0% by weight or more but 99% by weight or less. Metal ion scavengers are incorporated at 1% by weight or more but 60% by weight or less, preferably 3% by weight or more but 50% by weight or less on the basis of the total amount of these resin components. Other additives may be incorporated at 10% by weight or less, preferably 5% by weight or less of bonding materials. Conductive particles may be added at 1 vol % or more but 50 vol % or less, preferably 1 vol % or more but 30 vol % or less on the basis of bonding materials comprising the above components.

Bonding materials of the present invention can be in the form of a paste- or film-like product. Paste-like products may be solvent-free depending on the choice of materials, but normally prepared by dissolving or dispersing the above components in a solvent such as alcohols, ketones, esters, ethers, phenols, acetals, nitrogen-containing hydrocarbons, specifically toluene, methyl ethyl ketone, ethyl acetate, cellosolve acetate, etc. Solvents are used in an amount of about 20% by weight through 40% by weight of resin components.

Film-like products can be formed by applying the above paste in the form of a film on a release sheet such as release-treated polyethylene terephthalate and evaporating the solvent.

When a bonding material of the present invention is used to connect members to be connected such as plasma display panels or flexible printed wiring boards, the bonding material of the present invention is inserted between these members to be connected and heat and pressure are applied from both sides of the members to be connected, whereby the resin is cured to bond the members. If the bonding material is a paste, the bonding material is applied on a connection region containing electrodes of one member to be connected and, after drying or not, the other member to be connected is superposed and pressed, whereby the paste is cured. When the bonding material is a film, it may be inserted between members to be connected and cured under heat and pressure.

During the above connection process, the bonding material is inserted between members to be connected and heated to melt the resin of the bonding material, whereby the resin of the bonding material flows under pressure from regions containing opposite electrodes to regions containing no electrodes while conductive particles remain between electrodes and come into contact with the electrodes to bond them. The resin component having flown to regions containing no electrodes is cured at these regions with conductive particles dispersed therein to bond the members to be connected. Thus, electric connection between electrodes and mechanical bonding between members to be connected are achieved.

Bonding materials can be cured by not only heating but also irradiation such as UV. In the latter case, bonding materials suitably contain a resin component based on a photopolymerizable resin rather than a thermosetting resin.

Bonding materials of the present invention ensure good mechanical bonding and electric connection even when electrodes have small pitch, area and distance, because they use a metal scavenger having a smaller particle diameter than those of conductive particles.

The numeral references represent the following elements: 1, glass substrate; 2, 4, electrode; 3, resin film; 5, bonding material (film-like bonding material); 6, 16, resin; 7, 17, conductive particles; 8, 18, metal ion scavenger; 9, gap (region where electrodes are not present between the glass substrate and a flexible wiring board); 10, 50, bonded assembly; 15, bonding material (coating layer consisting of a paste-like bonding material); 20, panel (member to be connected); 30, flexible wiring board (member to be connected).

THE MOST PREFERRED EMBODIMENTS OF THE INVENTION

Embodiments of the present invention will now be described with reference to the attached drawings.

Figure 1A:
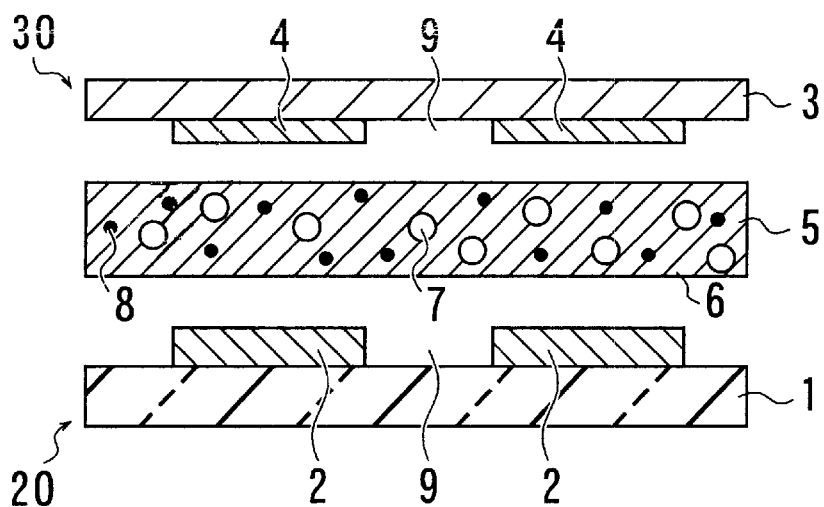
FIG. 1(a) is a schematic sectional view showing the state during the connection process using a film-like bonding material according to an embodiment of the present invention.
Figure 1B:
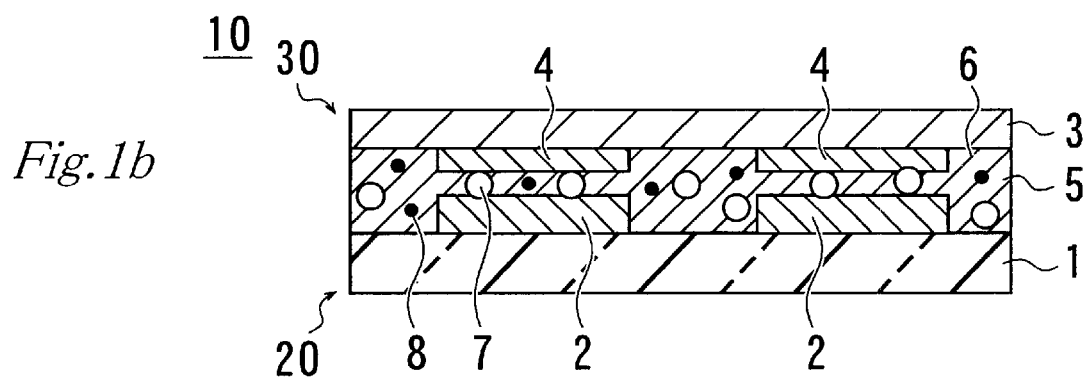
FIG. 1(b) is a schematic sectional view showing the state after connection.

FIG. 1(a) is a schematic sectional view showing the state during the connection process using a bonding material according to an embodiment, and FIG. 1(b) is a schematic sectional view showing the state after connection.

In FIGS. 1(a) and 1(b), reference 20 represents a panel used in a flat display device such as a plasma display panel.

This panel 20 has a glass substrate 1 and electrodes 2 consisting of a silver thin film patterned in a predetermined shape formed on the surface of glass substrate 1.

Reference 30 in FIGS. 1(a) and 1(b) represents a flexible printed wiring board having a resin film 3 consisting of a polyimide.

Electrodes 4 consisting of a copper thin film patterned in a predetermined shape, a nickel plating layer formed on the surface of said copper thin film and a gold plating layer formed on the surface of said nickel plating layer are formed on the surface of resin film 3 of flexible printed wiring board 30.

In order to connect panel 20 and flexible printed wiring board 30 as described above, the side of panel 20 having electrodes 2 and the side of flexible printed wiring board 30 having electrodes 4 are faced each other with a film-like bonding material 5 of the present invention being inserted therebetween, as shown in FIG. 1(a).

Electrodes 2 on panel 20 and electrodes 4 on flexible printed wiring board 30 are provided at locations corresponding to each other, and these electrodes 2, 4 are aligned to face each other with bonding material 5 being inserted between panel 20 and flexible printed wiring board 30, after which the assembly is pressed under heating.

Bonding material 5 comprises a resin 6 based on a thermosetting resin, conductive particles 7 and a metal ion scavenger 8 having a smaller particle size than that of conductive particles 7, and resin 6 of bonding material 5 is molten by heating to flow into regions 9 (gap) where electrodes 2, 4 are not present between panel 20 and flexible printed wiring board 30.

Then, the assembly is cooled to cure resin 6 of bonding material 5, whereby a bonded assembly 10 as shown in FIG. 1(b) is obtained.

Bonded assembly 10 is kept in an electrically connected state via conductive particles 7 remaining between electrodes 2, 4 and in contact with electrodes 2, 4, which are contact bonded to conductive particles 7 as resin 6 shrinks by curing. Good contact can be kept between electrodes 2, 4 and conductive particles 7 with excellent bonding strength and electric connection reliability as a result of using metal ion scavenger 8 having a particle diameter smaller than that of conductive particles 7 in bonding material 5.

Although the above embodiment is intended to connect plasma display panel 20 and flexible printed wiring board 30, the present invention may also be applied to connect a printed wiring board for driving a plasma display panel and flexible printed wiring board 20 as above or to connect other members to be connected.

The following examples further illustrate the present invention.

EXAMPLES

Examples 1–7, Comparative Examples 1–4

(Preparation of Bonding Materials)

A thermosetting resin bisphenol-A type epoxy resin (trade name "828" made by Yuka Shell) as one of resin components, an imidazole curing agent (trade name "2E4MZ" made by Shikoku Corp.) as curing agent, a thermoplastic resin phenoxy resin (trade name "YP50" made by Tohto Chemical Industry) as one of resin components, conductive particles (trade name "AU-205" made by Sekisui Fine Chemical, average particle diameter 5 $\mu$m), a coupling agent epoxy silane (trade name "A187" made by Nippon Unicar), a bismuth-antimony-based ion exchanger (trade name "IXE-633" made by Toagosei) as metal ion scavenger A, a vinyl triazine compound 2,4-diamino-6-vinyl-s-triazine-isocyanuric acid adduct (trade name "VT-OK" made by Shikoku Corp.) as metal ion scavenger B, and 2,4-diamino-6-methacryloyloxyethyl-s-triazine-isocyanuric acid adduct (trade name "MAVT-OK" made by Shikoku Corp.) as metal ion scavenger C were dissolved in toluene in the compositions shown in Tables 1 and 2 below to give 11 paste-like bonding materials.

Then, these paste-like bonding materials were coated in a dried film thickness of 40 $\mu$m on a polyethylene terephthalate release film and left in an oven with internal air circulation at 80° C. for 5 minutes to evaporate toluene, whereby film-like bonding materials of Examples 1–7 and Comparative examples 1–4 were obtained.

As shown in Tables 1 and 2 below, the compositions of bonding materials of Examples 1–7 and Comparative examples 1–4 used 4 parts by weight of the curing agent, 50 parts by weight of the phenoxy resin and 2 parts by weight of the coupling agent per 50 parts by weight of the bisphenol-A type epoxy resin, and 3 vol % of conductive particles on the basis of the total of each bonding material.

As shown in Table 1 below, Examples 1–3 used a bismuth-antimony-based ion exchanger as a metal ion scavenger (metal ion scavenger A) in an amount of 3 parts by weight in Example 1, 25 parts by weight in Example 2 and 50 parts by weight in Example 3 per 100 parts by weight of resin components consisting of bisphenol-A type epoxy resin and phenoxy resin.

Examples 4–6 used a vinyl triazine compound 2,4-diamino-6-vinyl-s-triazine-isocyanuric acid adduct as a metal ion scavenger (metal ion scavenger B) in an amount of 3 parts by weight in Example 4, 25 parts by weight in Example 5 and 50 parts by weight in Example 6 per 100 parts by weight of resin components consisting of bisphenol-A type epoxy resin and phenoxy resin.

Examples 7 used 2,4-diamino-6-methacryloyloxyethyl-s-triazine-isocyanuric acid adduct as a metal ion scavenger (metal ion scavenger C) in an amount of 25 parts by weight per 100 parts by weight of resin components consisting of bisphenol-A type epoxy resin and phenoxy resin.

(Preparation of Bonded Assemblies)

A plurality of silver electrodes having a film thickness of 8 $\mu$m and a width of 0.1 mm were formed at intervals of 0.1 mm on the surface of a glass substrate (trade name "PD200" made by Asahi Glass) to prepare 11 panels consisting of a glass substrate and electrodes.

Separately, a plurality of electrodes having a film thickness of 18 $\mu$m and a width of 0.1 mm were formed at intervals of 0.1 mm on the surface of a resin film consisting of a polyimide resin to prepare 11 flexible printed wiring boards consisting of a resin film and electrodes.

The electrodes on the flexible printed wiring boards here were made of a copper thin film formed on the surface of the resin film, a nickel film formed on the surface of the copper thin film and a gold plating film formed on the surface of the nickel film.

Each of the film-like bonding materials of Examples 1–7 and Comparative examples 1–4 prepared by the above process was inserted between the panel and the flexible printed wiring board with the side of the panel having electrodes and the side of the flexible printed wiring board having electrodes facing each other, and bonded under heat and pressure at 200° C., 40 kgf/cm$^2$ for 10 minutes to give bonded assemblies of Examples 1–7 and Comparative examples 1–4.

These bonded assemblies of Examples 1–7 and Comparative examples 1–4 were subjected to the "connection test" and "insulation test" shown below.

(Connection Test)

An electric current was applied across electrodes on the panel and flexible printed wiring board of each bonded assembly of Examples 1–7 and Comparative examples 1–4 to measure electric resistance of the assembly. The detected electric resistance values were ranked as follows: "o"=less than 5 Ω, "Δ"=5 Ω or more but less than 10 Ω, and "x"=10 Ω or more. These results are shown in Tables 1 and 2 below.

(Insulation Test)

Insulation resistance was measured between electrodes adjacent to each other through each of the bonding materials of the bonded assemblies of Examples 1–7 and Comparative examples 1–4 on the panel and flexible printed wiring board, and the measured values are shown as initial insulation resistance values in Tables 1 and 2 below.

Then, each of the bonded assemblies of Examples 1–7 and Comparative examples 1–4 was placed under a high-temperature and high-humidity condition at 60° C., relative humidity 85% and insulation resistance was measured over time between electrodes adjacent to each other through the bonding material of each bonded assembly on the panel and flexible printed wiring board under the application of a voltage of 100 VDC across the adjacent electrodes on the flexible printed wiring board and panel under this high-temperature and high-humidity condition.

Samples showing an insulation resistance of 10$^6$ Ω or more after application of a voltage of 100 VDC at high temperature and high humidity for 100 hours were judged as pass, while samples showing less than 10$^6$ Ω before a 100 hour lapse were judged as fail. These results are shown as voltage application test at high temperature and high humidity in Tables 1 and 2 below wherein "o" represents a pass result while the time at which insulation resistance dropped to less than 10$^6$ Ω is shown in case of fail.

TABLE 1

Compositions of bonding materials and evaluation results of connection test (Examples)

| | | Ex. 1 | Ex. 2 | Ex. 3 | Ex. 4 | Ex. 5 | Ex. 6 | Ex. 7 |
|---|---|---|---|---|---|---|---|---|
| Composition of bonding material | Bisphenol-A type epoxy resin | 50 | 50 | 50 | 50 | 50 | 50 | 50 |
| | Curing agent | 4 | 4 | 4 | 4 | 4 | 4 | 4 |
| | Phenoxy resin | 50 | 50 | 50 | 50 | 50 | 50 | 50 |
| | Conductive particle | 3 | 3 | 3 | 3 | 3 | 3 | 3 |
| | Coupling agent | 2 | 2 | 2 | 2 | 2 | 2 | 2 |
| | Metal ion scavenger A | 3 | 25 | 50 | 0 | 0 | 0 | 0 |
| | Metal ion scavenger B | 0 | 0 | 0 | 3 | 25 | 50 | 0 |
| | Metal ion scavenger C | 0 | 0 | 0 | 0 | 0 | 0 | 25 |
| | Average particle diameter of metal ion scavenger ($\mu$m) | 2 | 2 | 2 | 2 | 2 | 2 | 2 |
| | Specific surface area of metal ion scavenger (m$^2$/g) | 1.2 | 1.2 | 1.2 | 1.2 | 1.2 | 1.2 | 1.2 |
| Evaluation result of connection test | Conduction test | ○ | ○ | Δ | ○ | ○ | Δ | ○ |
| | Insulation test — Initial insulation resistance (Ω) | $10^{11}$ | $10^{11}$ | $10^{11}$ | $10^{11}$ | $10^{11}$ | $10^{11}$ | $10^{11}$ |
| | Voltage application test at high temperature and high humidity | ○ | ○ | ○ | ○ | ○ | ○ | ○ |

*In "Composition of bonding material" in Table 1 above, bisphenol-A type epoxy resin, curing agent, phenoxy resin, coupling agent and metal ion scavengers A-C are expressed in parts by weight, and conductive particle is expressed in the volume of conductive particles (vol %) based on the total of each bonding material.

TABLE 2

Compositions of bonding materials and evaluation results of connection test (Comparative examples)

| | | Co. ex. 1 | Co. ex. 2 | Co. ex. 3 | Co. ex. 4 |
|---|---|---|---|---|---|
| Composition of bonding material | Bisphenol-A type epoxy resin | 50 | 50 | 50 | 50 |
| | Curing agent | 4 | 4 | 4 | 4 |
| | Phenoxy resin | 50 | 50 | 50 | 50 |
| | Conductive particle | 3 | 3 | 3 | 3 |
| | Coupling agent | 2 | 2 | 2 | 2 |
| | Metal ion scavenger A | 0 | 70 | 0 | 0 |
| | Metal ion scavenger B | 0 | 0 | 100 | 25 |
| | Metal ion scavenger C | 0 | 0 | 0 | 0 |
| | Average particle diameter of metal ion scavenger ($\mu$m) | — | 2 | 2 | 10 |
| | Specific surface area of metal ion scavenger (m$^2$/g) | — | 1.2 | 1.2 | 1.5 |
| Evaluation result of connection test | Conduction test | ○ | X | X | X |
| | Insulation test — Initial insulation resistance (Ω) | $10^{11}$ | $10^{11}$ | $10^{11}$ | $10^{11}$ |
| | Voltage application test at high temperature and high humidity | 12 | ○ | ○ | ○ |

*In "Composition of bonding material" in Table 2 above, bisphenol-A type epoxy resin, curing agent, phenoxy resin, coupling agent and metal ion scavengers A–C are expressed in parts by weight, and conductive particle is expressed in the volume of conductive particles (vol %) based on the total of each bonding material.

The results of Tables 1 and 2 show that insulation resistance loss is marked in Comparative example 1 where 0 parts by weight of metal ion scavenger is added per 100 parts by weight of resin components while electric connectability is low as apparent from the high electric resistances of bonded assemblies in "connection test" in Comparative examples 2 and 3 where 70 parts by weight or more of metal ion scavenger is added per 100 parts by weight of resin components.

In contrast, the results of "connection test" and "insulation test" were excellent in Examples 1–7 where metal ion scavenger is added of 3 parts by weight or more but 50 parts by weight or less per 100 parts by weight of resin components.

These results show that metal ion scavengers should be added from a lower limit exceeding 0 parts by weight but 3 parts by weight or less to an upper limit of 50 parts by weight or more but less than 70 parts by weight per 100 parts by weight of resin components.

Therefore, bonding materials of the present invention are assumed to preferably contain metal ion scavengers in an amount of the medium or more of the lower limit range but the medium or less of the upper limit range, i.e. 1.5 parts by weight or more but 60 parts by weight or less per 100 parts by weight of resin components.

Moreover, electric connectability is low in Comparative example 4 where metal ion scavenger has an average particle diameter larger than that of conductive particles.

Although the foregoing examples relate to film-like bonding materials 5 used to connect a flexible printed wiring board and a panel, the present invention is not limited to this embodiment but also encompasses paste-like bonding materials, for example.

Figure 2A:
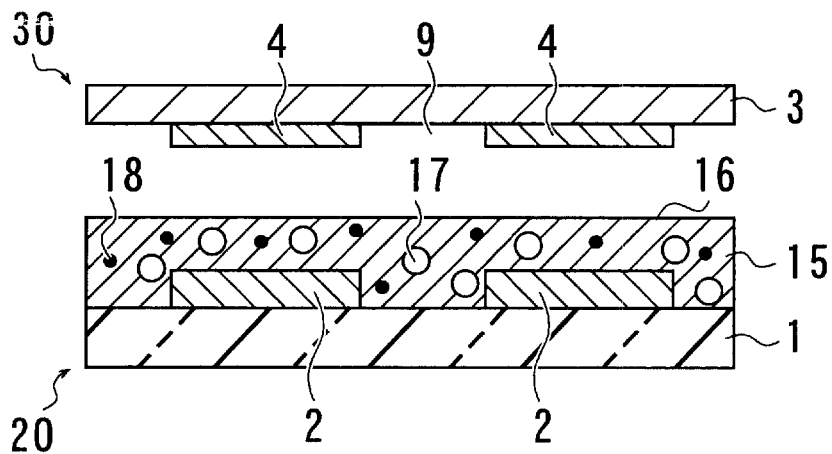
FIG. 2(a) is a schematic sectional view showing the state during the connection process using a paste-like bonding material according to an embodiment of the present invention.

Referring to FIG. 2(a), references 20 and 30 in FIG. 2(a) represent a panel and a flexible printed wiring board similar to those shown in FIG. 1, respectively. These panel 20 and flexible printed wiring board 30 are connected by at first, applying a paste-like bonding material of the present invention on the side of panel 20 having electrodes 2 to form a coating layer 15 consisting of the paste-like bonding material.

Then, the side of flexible printed wiring board 30 having electrodes 4 and the side of panel 20 having coating layer 15 are faced each other and electrodes 2, 4 on flexible printed wiring board 30 and panel 20 are aligned to face each other, after which electrodes 4 on flexible printed wiring board 30 are pressed against the surface of coating layer 15, as shown in FIG. 2(a).

Then, the assembly is heated under pressure to lower the viscosity of resin 16 in coating layer 15 by heating so that resin 16 flows into regions 9 where electrodes 2, 4 are not present between panel 20 and flexible printed wiring board 30.

Figure 2B:
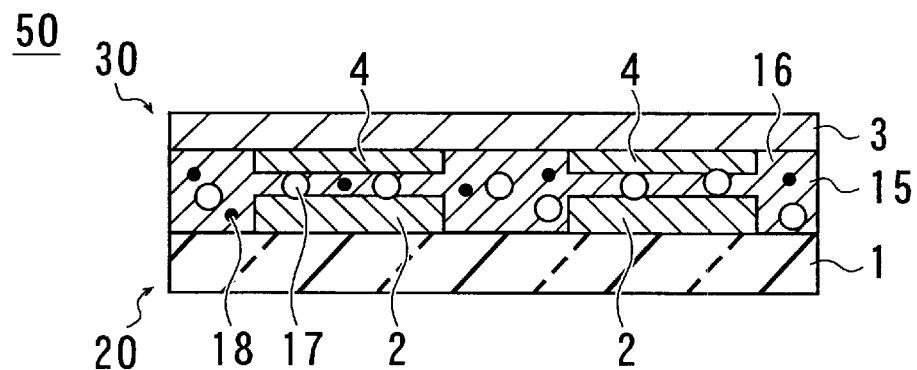
FIG. 2(b) is a schematic sectional view showing the state after connection.

Then, the assembly is cooled to cure resin 16, whereby a bonded assembly as represented by reference 50 in FIG. 2(b) is obtained.

Similarly to bonded assembly 10 shown in FIG. 1(b), bonded assembly 50 shown in FIG. 2(b) is kept in an electrically connected state via conductive particles 17 remaining between electrodes 2, 4 with high reliability in electric connection between electrodes 2, 4 by using metal ion scavenger 18 having an average particle diameter smaller than that of conductive particles 17 in the bonding material constituting bonding material layer 15.

The embodiment described just above may also be applied to connect a plasma display panel and a flexible printed wiring board, or connect a printed wiring board for driving a plasma display panel and a flexible printed wiring board, or connect other members to be connected.

ADVANTAGES OF THE INVENTION

Bonding materials of the present invention show excellent adhesion, electric connection and insulation properties so that they can be used to connect members to be connected having opposite electrodes for high voltage or high current applications without causing short circuit between adjacent electrodes even under the application of high voltage or high current, because they use a thermosetting resin, conductive particles and a metal ion scavenger having a smaller particle diameter than those of conductive particles.

Bonded assemblies obtained by bonding a plasma display panel and a flexible printed wiring board can be used under the application of high voltage or high current across electrodes without causing short circuit between adjacent electrodes by migration, because metal ions dissociating from electrodes under the application of high voltage or high current are scavenged by the metal ion scavenger.

What is claimed is:

1. A bonded assembly comprising opposite electrodes and a bonding material inserted between said electrodes and heat cured to at least electrically connect said electrodes: said electrodes containing copper dissociating as metal ions, and said bonding material comprising conductive particles, metal ion scavenger particles for scavenging metal ions liberated from said electrodes, and a resin component based on a thermosetting resin, wherein said metal ion scavenger particles are present in an amount of 1.5 parts by weight or more but 60 parts by weight or less per 100 parts of the resin component, wherein said metal ion scavenger particles contain a vinyl triazine compound and have an average diameter that is 0.1 μm or more but less than 10 μm, said average diameter of said metal ion scavenger particles being smaller than that of said conductive particles, and wherein a voltage applied across said opposite electrodes is 50V or more but 500V or less.

2. The bonding material according to claim 1 wherein said metal ion scavenger particles are present 3 parts by weight or more but 50 parts by weight or less per 100 parts by weight of said resin component.

3. The bonding material according to claim 1 wherein said conductive particles have an average particle diameter of 1 μm or more but 60 μm or less.

4. The bonding material according to claim 1 wherein said metal ion scavenger particles have a specific surface area of 0.8 m²/g or more but 100 m²/g or less.

* * * * *